(12) United States Patent
Yang et al.

(10) Patent No.: US 6,574,861 B1
(45) Date of Patent: Jun. 10, 2003

(54) SYSTEM AND METHOD FOR SOLDER BALL REWORK

(75) Inventors: Hong Yang, San Diego, CA (US);
Laxminarayan Sharma, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 150 days.

(21) Appl. No.: 09/832,779

(22) Filed: Apr. 11, 2001

(51) Int. Cl.[7] ................................................ H01R 9/00
(52) U.S. Cl. .............................. 29/843; 29/834; 29/840; 29/841; 29/852
(58) Field of Search ......................... 29/843, 834, 841, 29/840, 852

(56) References Cited

U.S. PATENT DOCUMENTS

| | | |
|---|---|---|
| 4,384,288 A | 5/1983 | Walton |
| 4,575,621 A | 3/1986 | Dreifus |
| 4,598,275 A | 7/1986 | Ross et al. |
| 4,664,289 A | 5/1987 | Shimizu et al. |
| 4,730,849 A | 3/1988 | Siegel |
| 4,732,411 A | 3/1988 | Siegel |
| 4,733,362 A | 3/1988 | Haraguchi |
| 4,785,969 A | 11/1988 | McLaughlin |
| 4,823,982 A | 4/1989 | Aten et al. |
| 4,835,372 A | 5/1989 | Gombrich et al. |
| 4,839,806 A | 6/1989 | Goldfischer et al. |
| 4,847,764 A | 7/1989 | Halvorson |
| 4,850,009 A | 7/1989 | Zook et al. |
| 4,857,713 A | 8/1989 | Brown |
| 4,857,716 A | 8/1989 | Gombrich et al. |
| 4,898,578 A | 2/1990 | Rubalcaba, Jr. |
| 4,916,441 A | 4/1990 | Gombrich |
| 4,978,335 A | 12/1990 | Arthur, III |
| 5,014,875 A | 5/1991 | McLaughlin et al. |
| 5,071,168 A | 12/1991 | Shamos |
| 5,078,683 A | 1/1992 | Sancoff et al. |
| 5,104,374 A | 4/1992 | Bishko et al. |
| 5,193,855 A | 3/1993 | Shamos |
| 5,202,929 A | 4/1993 | Lemelson |
| 5,208,762 A | 5/1993 | Charhut et al. |
| 5,213,232 A | 5/1993 | Kraft et al. |
| 5,256,157 A | 10/1993 | Samiotes et al. |
| 5,272,318 A | 12/1993 | Gorman |
| 5,274,913 A | 1/1994 | Grebe et al. .................. 29/840 |
| 5,317,506 A | 5/1994 | Coutre et al. |

(List continued on next page.)

Primary Examiner—Timothy V. Eley
Assistant Examiner—Alvin J. Grant
(74) Attorney, Agent, or Firm—Gray Cary Ware & Freidenrich; Terrance A. Meador

(57) ABSTRACT

A system and method have been provided for removing high lead content solder balls from the surface of a circuit package for the purpose of rework. The invention is applicable to ball grid array (BGA), C4 balls, chip scale balls, and flip chip bumps. Advantageously, the room temperature solder ball rework procedure minimizes damage to the circuit package. Specifically, a thin-film stainless steel mask with openings to expose the solder balls, is formed over the circuit package, and the solder balls are removed in a shearing or grinding operation, leaving a solder ball residue. Then, a conventional thick mask film is formed and a solder paste is deposited to fill the apertures. The solder ball residue forms a wettable surface for the low temperature attachment of new solder balls.

34 Claims, 4 Drawing Sheets

U.S. PATENT DOCUMENTS

| | | |
|---|---|---|
| 5,319,363 A | 6/1994 | Welch et al. |
| 5,319,711 A | 6/1994 | Servi |
| 5,371,328 A | 12/1994 | Gutierrez et al. ........... 174/261 |
| 5,381,487 A | 1/1995 | Shamos |
| 5,401,059 A | 3/1995 | Ferrario |
| 5,405,048 A | 4/1995 | Rogers et al. |
| 5,408,655 A | 4/1995 | Oren et al. |
| 5,445,621 A | 8/1995 | Poli et al. |
| 5,460,294 A | 10/1995 | Williams |
| 5,480,062 A | 1/1996 | Rogers et al. |
| 5,502,944 A | 4/1996 | Kraft et al. |
| 5,508,499 A | 4/1996 | Ferrario |
| 5,522,525 A | 6/1996 | McLaughlin et al. |
| 5,527,289 A | 6/1996 | Foster et al. |
| 5,541,583 A | 7/1996 | Mandelbaum |
| 5,548,660 A | 8/1996 | Lemelson |
| 5,591,941 A | 1/1997 | Acocella et al. ............ 174/266 |
| 5,629,981 A | 5/1997 | Nerlikar |
| 5,643,212 A | 7/1997 | Coutre et al. |
| 5,646,912 A | 7/1997 | Cousin |
| 5,659,203 A | 8/1997 | Call et al. ................... 257/778 |
| 5,681,285 A | 10/1997 | Ford et al. |
| 5,713,856 A | 2/1998 | Eggers et al. |
| 5,745,366 A | 4/1998 | Higham et al. |
| 5,760,337 A | 6/1998 | Iyer et al. .................. 174/52.2 |
| 5,772,635 A | 6/1998 | Dastur et al. |
| 5,782,805 A | 7/1998 | Meinzer et al. |
| 5,882,338 A | 3/1999 | Gray |
| 5,930,597 A | 7/1999 | Call et al. ................... 438/106 |
| 5,953,210 A | 9/1999 | Lo .............................. 361/704 |
| 5,954,700 A | 9/1999 | Kovelman |
| 5,980,501 A | 11/1999 | Gray |
| 6,019,745 A | 2/2000 | Gray |
| 6,070,761 A | 6/2000 | Bloom et al. |
| 6,110,152 A | 8/2000 | Kovelman |
| 6,138,349 A | 10/2000 | Vinciarelli et al. ........... 29/841 |
| 6,168,972 B1 | 1/2001 | Wang et al. ................ 438/108 |

SYSTEM AND METHOD FOR SOLDER BALL REWORK

BACKGROUND OF THE INVENTION

1. Field of the Invention

This invention relates generally to circuit fabrication and rework procedures and, more particularly, to a system and method for removing and replacing solder balls on ball grid array type circuit packages.

2. Description of the Related Art

Solder balls are used to make circuit interconnections, between ceramic, printed circuit boards, chip scale packages, and integrated circuit (IC) flip chips. There are a variety of solder ball connection processes that are generally related, but differ in terms of scale the size of the circuit packages and the solder balls.

As noted in U.S. Pat. No. 5,274,913 (Grebe et al.), which is incorporated herein by reference, within a single integrated circuit, circuit component to circuit component and circuit to circuit interconnection, heat dissipation, and mechanical protection are provided by an integrated circuit chip. This chip enclosed within its module is referred to as the first level of packaging. There is at least one further level of packaging. The second level of packaging is the circuit card. A circuit card performs several functions. The circuit card is employed because the total required circuit or bit count to perform a desired function exceeds the bit count of the first level package, i.e., the chip. The circuit card also provides for signal interconnection with other circuit elements, other circuit cards, or carrier substrates.

In order for the card to accomplish these functions the I/C chip must be bonded to the card, and connected to the wiring of the card. When the number of I/O's per chip was low, serial wire bonding of the I/O's around the periphery of the chip was a satisfactory interconnection technology. But, as the number of I/O's per chip has increased, tape automated bonding (hereinafter "TAB" bonding) has supplanted serial wire bonding. To handle an even larger number of I/O's per chip various "flip chip" bonding methods were developed. In these so-called "flip chip" bonding methods the face of the IC chip is bonded to the card.

Flip-chip bonding permits the formation of a pattern of solder bumps on the entire face of the chip. In this way, the use of a flip chip package allows full population area arrays of I/O. In the flip chip process, solder bumps are deposited on solder wettable terminals on the chip and a matching footprint of solder wettable terminals are provided on the card. The chip is then turned upside down, hence the name "flip chip," the solder bumps on the chip are aligned with the footprints on the substrate, and the chip to card joints are all made simultaneously by the reflow of the solder bumps.

In the controlled collapse chip connection (C4) process, as distinguished from the earlier flip chip process, the solder wettable terminals on the chip are surrounded by ball limiting metallurgy ("BLM"), and the matching footprint of solder wettable terminals on the card are surrounded by glass dams or stop-offs, which are referred to as top surface metallurgy ("TSM"). These structures act to limit the flow of molten solder during reflow.

The ball limiting metallurgy ("BLM") on the chip is typically a circular pad of evaporated, thin films of Cr, Cu, and/or Au. The Cr dam formed by this conductive thin film well restrains the flow of the solder along the chip, seals the chip module, and acts as a conductive contact for the solder.

In prior art processes the BLM and solder are deposited by evaporation through a mask, forming an array of I/O pads on the wafer surface. The term "mask" is used generically. The mask can be a metal mask. Alternatively, as used herein, the "mask" can refer to a sequence of BLM deposition, photoresist application, development of the photoresist, and deposition, as described below, of solder, followed by simultaneous removal of the photoresist and subetching of the BLM, with the solder column acting as a mask.

In C4 processes, the Pb/Sn is typically deposited from a molten alloy of Pb and Sn. The Pb has a higher vapor pressure then Sn, and deposits first, followed by a cap of Sn. The solder is deposited on the chip by evaporation, vacuum deposition, vapor deposition, or electrodeposition into the above described BLM wells, thereby forming solder columns therein. The resulting solder deposit, referred to herein as a column or a ball, is a cone-frustrum body of Pb surrounded by an Sn cap. This column or ball may be reflowed, for example by heating in an $H_2$ atmosphere, to homogenize the solder and form solder bumps for subsequent bonding.

The solder is typically a high lead solder, such as 95 Pb/5 Sn. In conventional C4 processes, 95/5 solders are preferred because the high lead solders of this stoichiometry have a high melting point, e.g., above about 315 degrees Centigrade. Their high melting temperature allows lower melting point solders to be used for subsequent connections in the microelectronic package.

The wettable surface contacts on the card are the "footprint" mirror images of the solder balls on the chip I/O's. The footprints are both electrically conductive and solder wettable. The solder wettable surface contacts forming the footprints are formed by either thick film or thin film technology. Solder flow is restricted by the formation of dams around the contacts.

The chip is aligned with the card and then joined to the card by thermal reflow. Typically, a flux is used in the C4 processes. The flux is placed on the substrate, or chip, or both, to hold the chip in place. The assembly of chip and card is then subject to thermal reflow in order to join the chip to the card. After joining the chip and card it is necessary to remove the flux residues. This requires the use of organic solvents, such as aromatic solvents and halogenated hydrocarbon solvents, with their concomitant environmental concerns.

The C4 process is a substantially self-aligning assembly process. This is because of the interaction of the geometry of the solder columns or balls prior to reflow, with the surface tension of the molten solder during reflow and geometry of the solder columns. When the mating surfaces of solder column on the chip and the conductive footprint contact on the card touch, the surface tension of the molten solder promotes self alignment.

As in all solder processes, rework may be needed when solder balls are used, due to alignment problems, process temperatures, accidental solder bridging between pads on the circuit package, and damage to the solder balls themselves. Solder ball reworking (reballing) is typically accomplished through a reflow process. The detailed process steps are:

1. demounting solder ball components on the circuit package;
2. removing the solder residue through a solder wicking, hot gas dress tool, or similar process;

3. positioning the solder paste or flux;
4. replacing the solder balls; and
5. reflowing, to attach the solder balls.

One of the key steps in the aforementioned reballing process is the demounting, which requires the heating of the package to an elevated temperature. Heating is a conventional solution for eutectic solder balls or eutectic/high lead ball connection such as in the traditional ceramic BGA (CBGA) packages. However, it is not a solution for the high lead ball grid array (BGA) ball configuration.

The problem with heating the package to remove high lead solder balls is the high temperature needed to melt the high lead solder. For example, the melting temperature of 90% lead (Pb)/10% tin (Sn) solder is approximately 308 degrees C. However, the finished package contains other materials, such as molding compounds, underfill, lid attach, and die attach materials, that may be damaged at the relatively high temperatures needed to reflow high lead solder.

Another problem in the above-mentioned rework process stems from the non-uniform wettable surface that results from removing the solder balls at melting temperature. Neither does this rework process address the issue of solder particle contamination that can occur in the high temperature solder ball removal process.

It would be advantageous if an efficient procedure could be developed to remove high lead solder balls from a ball grid type array package.

It would be advantageous if the high lead balls could be removed without a high temperature reflow process.

It would be advantageous if a solder ball removal process could provide a uniform wettable surface from ball reattachment.

It would also be advantageous if a process could efficiently reattach high lead solder balls to a circuit package without a high temperature reflow process.

SUMMARY OF THE INVENTION

Accordingly, a method is provided for removing solder balls attached to a ball grid array circuit package. The method is useful for BGA balls, C4 balls, chip scale package (CSP) balls, flip chip bumps, and solder columns.

The method comprises: forming a thin stainless steel mask, with a thickness of about 2 mils overlying a first surface of a ball grid array circuit package, to expose high lead solder balls attached to pad areas of the surface; removing enough of the exposed solder balls, using a grinding or shearing operation to leave a ball residue attached to the surface pads; removing the thin film mask; forming a thick film mask overlying the first surface that exposes the ball residue attached to the surface pads; depositing solder paste over the ball residue; and, heating the solder paste to a temperature in the range of 183 to 225 degrees C.

The thick film mask has a thickness in the range from 5 to 10 mils. The method also comprises forming openings in the thick film mask to define an aspect ratio, which is the ratio of the mask thickness to the area of the opening. A lower range aspect ratio is helpful in improving the release of the deposited solder paste in response to the lower range aspect ratio mask openings. A higher range aspect ratio, however, is helpful in increasing the volume of the deposited solder paste, making the solder ball reattachment easier. Likewise the opening diameters can be sized to increase or decrease the volume of deposited solder paste.

DETAILED DESCRIPTION OF THE PREFERRED EMBODIMENTS

Figure 1:
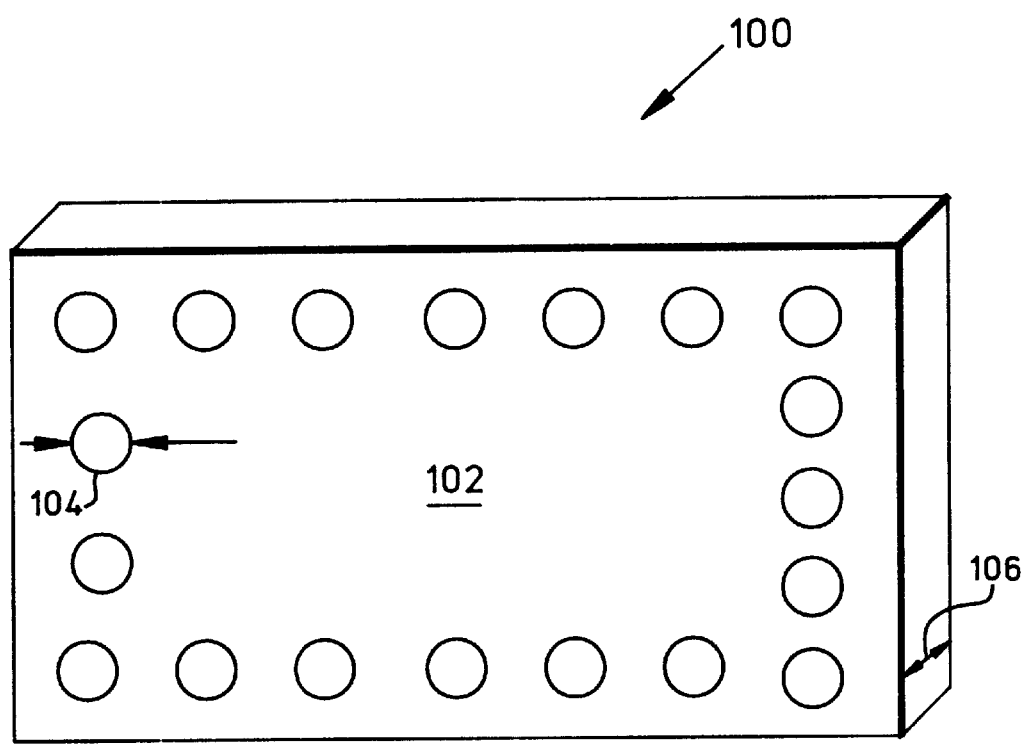
FIG. 1 is a diagram illustrating the solder ball removal device of the present invention.

FIG. 1 is a diagram illustrating the solder ball removal device of the present invention. The solder ball removal device 100 is used to demount solder balls soldered to a circuit package surface. The device comprises a thin planar sheet of film 102, formed to overlie a circuit package surface (not shown) to receive a removal element (not shown). The device 100 has openings in the film 102, such as opening 104, to expose solder balls (not shown) attached to the circuit package surface. The solder ball removal device will be referred to herein as a thin film mask. As discussed above in the Background Section, a mask is a sheet of material that temporarily overlies the surface of an IC substrate with defined openings to expose predetermined areas of the substrate. Typically, the mask permits the exposed areas of the substrate surface to be processed while the mask-covered areas are protected from the consequences of the process. For example, a mask can be applied to etch exposed areas of the IC surface. The mask in the present invention permits areas of an IC surface to be exposed to a shearing or grinding operation, while protecting the unexposed areas.

The film 102 has a thickness 106 in the range from 2 to 5 mils, and is typically made of a stainless steel material, molybdenum, hard plastic, or equivalent material to withstand the removal process described below. Alternately, the film 102 has a maximum thickness 106 that is equal to approximately ⅓ the solder ball diameter that is to be removed. The solder ball diameter is defined to be diameter of the ball before collapse or reflow, when the ball has a more spherical shape. In place, the solder ball height is approximately two-thirds (⅔) the solder ball diameter. Therefore, the maximum thickness of film 102 is approximately two-ninths (2/9) the solder ball height. The removal element is selected from group including a shear, a grinder, and a chemical-mechanical polisher (CMP).

Figure 3:
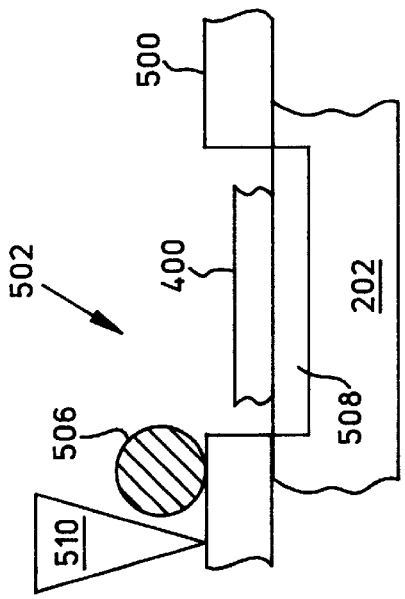
FIGS. 2 through 7 illustrate the ball removal process using the above-described ball removal device.
Figure 2:
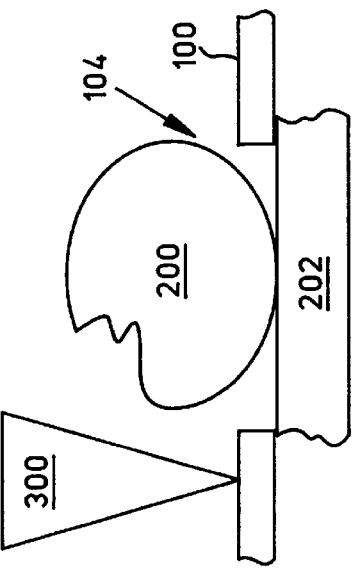
Figure 4:
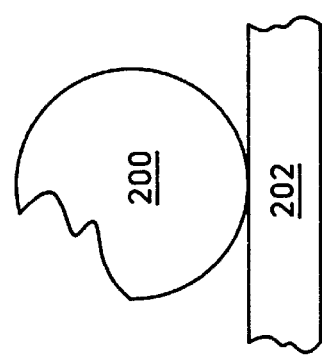

FIGS. 2 through 7 illustrate the ball removal process using the above-described ball removal device. The solder ball removal process is achieved by mechanically removing solder balls using several possible methods. One method is to use a ball shearing wedge. FIG. 2 depicts a damaged solder ball 200 to be removed from a circuit package 202. In FIG. 3 the thin film mask 100 of FIG. 1 has been deposited and a ball shearing wedge 204 is shown. The wedge 204 acts to remove the portion of the ball 200 protruding above the mask 100. A similar result can be achieved by a mechanical or chemical-mechanical polishing (CMP) operation. The end result of the shearing/grinding operation is shown in FIG. 4.

The thin metal mask 100 serves three functions. The mask 100 protects the active metal area on the substrate circuit package top surface from being damaged during the ball shearing/grinding operation. The mask also provides a uniform thin layer of residual high lead solder on the bond pads. This solder residue 400 can be seen in FIG. 4. The mask also acts to keep the solder debris away from the active metal area on the circuit package surface. After the shearing/grinding operation, the thin film mask 100 is removed.

Figure 5:
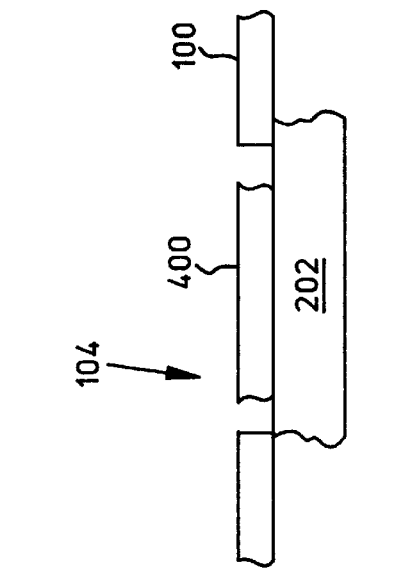

FIG. 5 illustrates the use of a conventional stencil, or thick film mask 500 with selectively formed openings, such as opening 502 with appropriate aperture size to print a low melting solder paste 506 through for deposition onto the bond pads 508 and solder residue 400. The thick film mask material can be a photoresist, oxide, nitride, or any other material specifically tailored to accord with previous or subsequent IC processes or materials that are not specifically related to the present invention. The thick film mask can be formed (and removed) by any conventional IC process.

In some aspects of the invention, the solder paste includes flux or similar agents to control solder flow. As shown, a wedge 510 or equivalent tool is used to distribute the solder paste.

Figure 6:
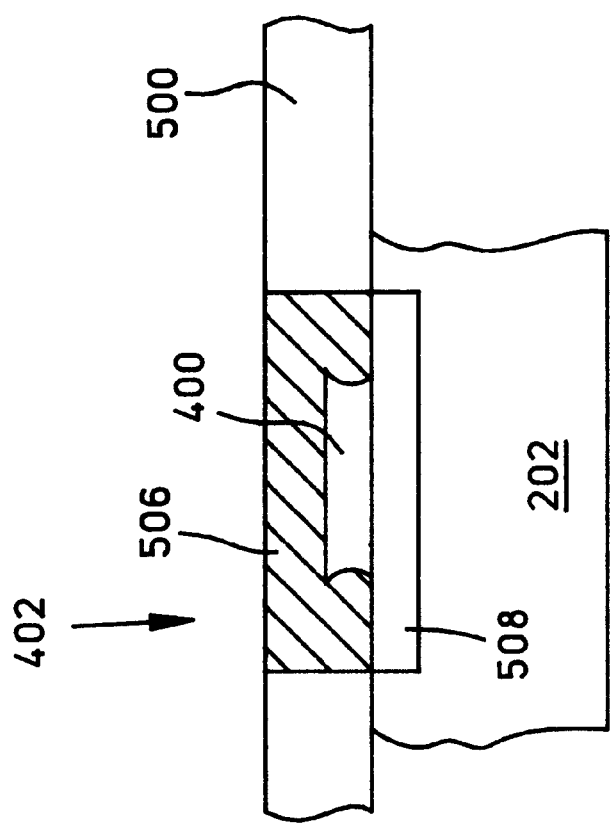

FIG. 6 illustrates the results of the solder paste distribution operation. As shown, the aperture, or opening in the thick film mask is filled with the sheared solder residue 400 and the solder paste 506 (shown as the cross-hatched area). The aperture 402 has a diameter and aspect ratio to form an aperture volume that is in the range from 15 to 30% of the corresponding solder ball. The aperture volume can be defined as the volume of solder paste 502 in the aperture 402.

Figure 7:
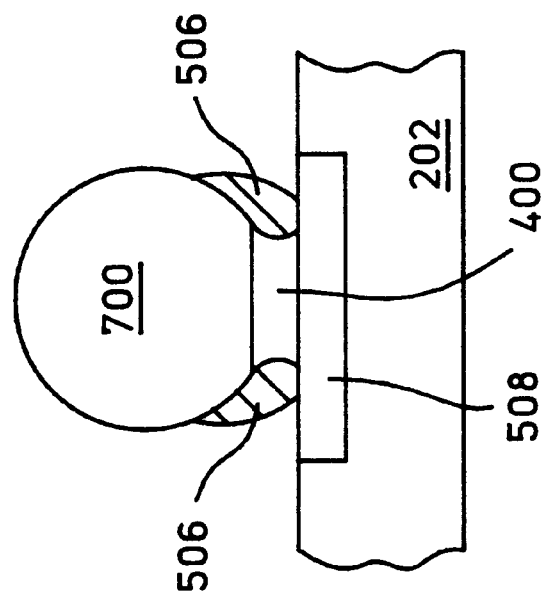

FIG. 7 illustrates the deposition of a preformed solder ball 700, placed onto the solder paste 506, overlying pad 508. At this point, the thick film mask 500 (see FIG. 6) has been removed. A standard reflow process with a peak temperature in the range of 183 to 225° C. is applied to the circuit package 202 to allow the eutectic solder to reflow and solidify, holding the preformed solder ball 700 in place to form the BGA ball grid arrays on the surface of the circuit package 202. As used herein, eutectic solder is a solder having a relatively low melting temperature, typically with a 63/37 ration of lead to tin. In other aspects of the invention (not shown), the thick film mask left on the surface and is used to help position the solder balls to be attached. After attached of the solder balls the thick film mask is removed. In this later-mentioned scenario, the thick film mask aperture diameter is typically greater than the solder ball, to simplify the mask removal process.

Thus, the damaged solder ball 200 can be removed without a high temperature that can result in degradation of the underfill and die attach materials of the circuit package 200. As shown especially in FIGS. 4 and 5, the present invention rework process creates a uniform wettable surface due to the use of a thin metal mask 100 during ball shear. Although the invention is generally presented in the context of a BGA array, it can be scaled for applications using flip chip bumps at the die level and CSP/BGA solder balls at the substrate level for flip chip, chip scale and ball grid array circuit packages. A CSP package has a size that is 1.2 times the IC die size, or less. Also, although the process has been illustrated with only a single solder ball, the invention actually permits simultaneous reballing across the entire package having a plurality of solder ball interfaces. It should also be understood that although the process is well suited for the rework of high lead (90% or greater) solder balls, it is applicable to reworking of solder balls having much lower melting temperatures.

Figure 8:
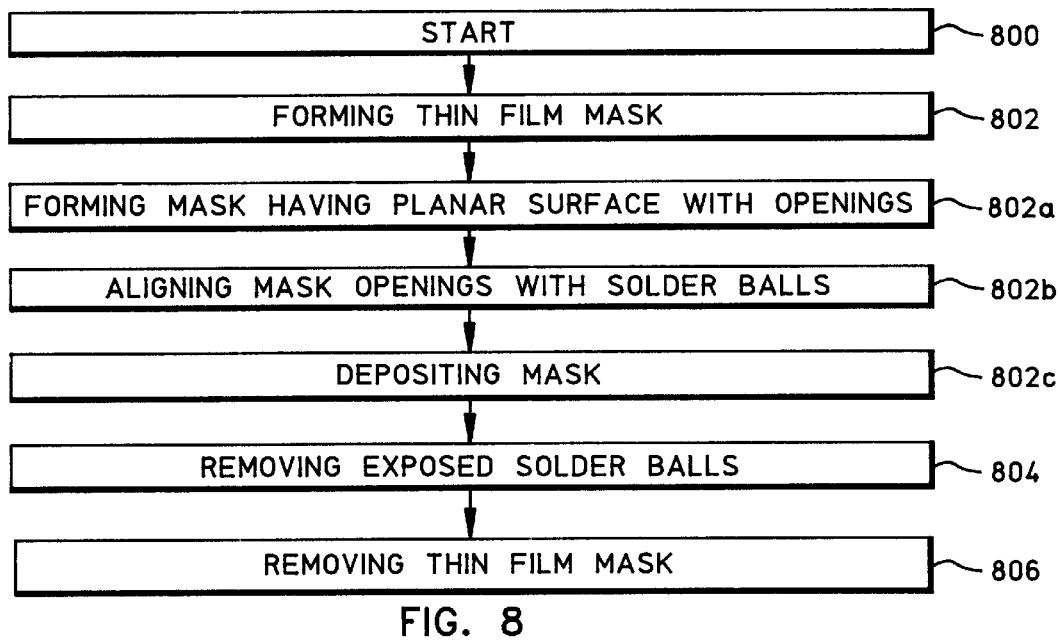
FIG. 8 is a flowchart depicting a method for removing solder balls attached to a ball grid array circuit package.

FIG. 8 is a flowchart depicting a method for removing solder balls attached to a ball grid array circuit package. Although the method is depicted as a series of numbered steps for clarity, no order should be inferred from the numbering unless explicitly stated. The method begins with Step 800. Step 802 forms a thin film mask overlying a first surface of a ball grid array circuit package, exposing solder balls attached to pad areas of the surface. Step 804 removes the exposed solder balls. Step 806 removes the thin film mask.

In some aspects of the invention, removing the exposed solder balls in Step 804 includes removing the solder balls with a process selected from the group including shearing, grinding, and chemical-mechanical polishing (CMP). Typically, removing the exposed solder balls in Step 804 includes removing the exposed solder balls at room temperature.

In some aspects, forming a thin film mask overlying a first surface of a ball grid array circuit package in Step 802 includes forming a mask having a substantially planar surface with openings to expose the solder balls attached to the underlying circuit package surface.

In some aspects of the invention, forming a thin film mask overlying a first surface of a ball grid array circuit package in Step 802 includes forming a mask having a thickness in the range from 2 to 5 mils. To account for the scaling of different sized solder balls, the thin film mask can alternately be defined as having a maximum thickness that is equal to approximately ⅓ the solder ball diameter.

In some aspects, forming a thin film mask overlying a first surface of a ball grid array circuit package in Step 802 includes forming a thin film mask from a stainless steel, molybdenum, hard plastic, or equivalent material.

In some aspects of the invention, forming a thin film mask overlying a first surface of a ball grid array circuit package in Step 802 includes sub-steps. Step 802a forms a mask having a substantially planar surface with openings. Step 802b aligns the mask openings with the solder balls attached to the circuit package surface. Step 802c deposits the mask on the circuit package surface.

In some aspects, the balls attached to the circuit package are selected from the group including ball grid array (BGA) balls, C4 balls, chip scale package (CSP) balls, flip chip bumps, and solder columns (which generally resemble the shape and function of the solder balls. The balls are selected from the group including eutectic solder, eutectic/high lead solder, and high lead balls. A high lead (content) ball as referred to herein is a ball with 90%, or greater lead content. However, the degree of lead content is directly related to melting temperature, and the method is applicable to any relatively high temperature solder rework and reflow process. In some aspects, the solder balls have a melting temperature of 183 degrees C., or higher.

In some aspects of the invention, the ball grid array circuit package is selected from the group including flip chip, chip scale, ball grid array, ceramic, and semiconductor packages.

Figure 9:
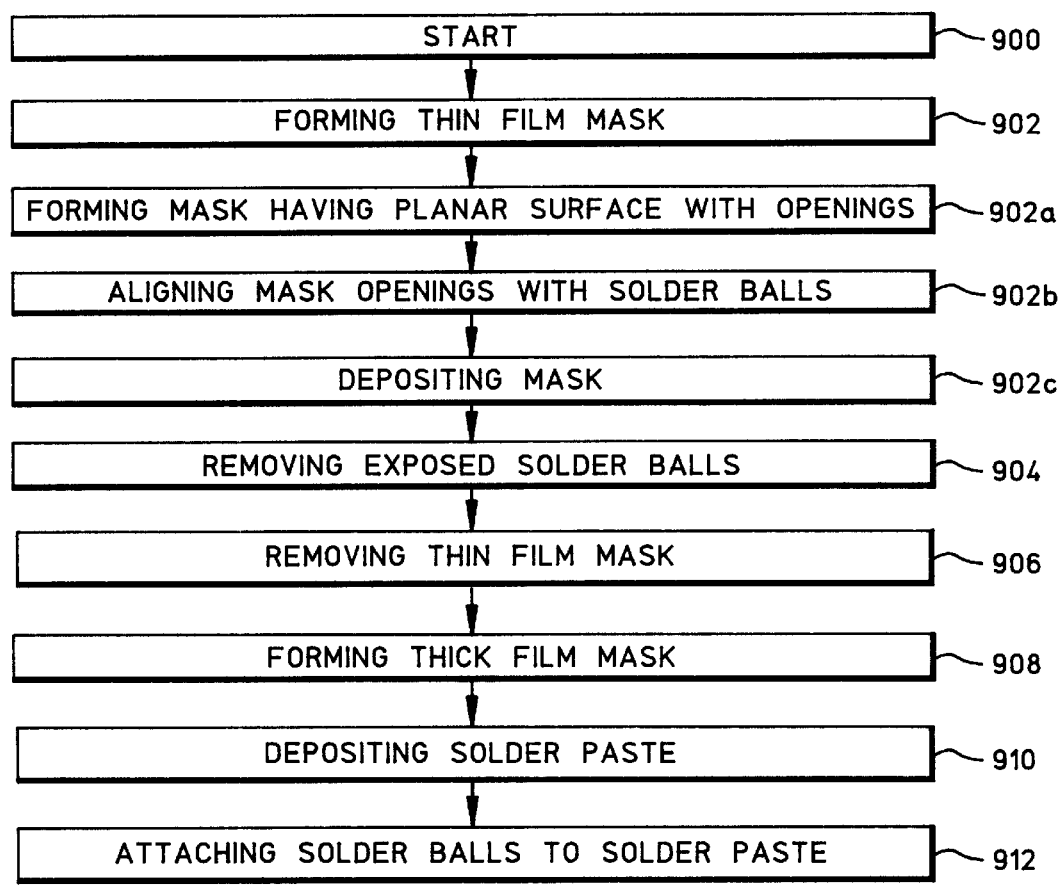
FIG. 9 is a flowchart illustrating a method for reworking solder balls attached to a ball grid array circuit package.

FIG. 9 is a flowchart illustrating a method for reworking solder balls attached to a ball grid array circuit package. The method begins with Step 900. Step 902 forms a thin film mask overlying a first surface of a ball grid array circuit package, exposing solder balls attached to pad areas of the surface. Step 904 removes the exposed solder balls to leave a ball residue attached to the surface pads. Step 906 removes the thin film mask. Step 908 forms a thick film mask overlying the first surface, exposing the ball residue attached to the surface pads. Step 910 deposits solder paste over the ball residue. Step 912 attaches solder balls to the solder paste.

In some aspects of the invention, forming a thick film mask in Step 908 includes forming a substantially planar surface with openings to expose the ball residue. Forming a thick film mask in Step 908 includes forming a mask having a thickness in the range from 5 to 10 mils.

In some aspects of the invention, forming an opening having an aspect ratio in Step 908 includes forming a lower range aspect ratio. Depositing solder paste to overlie the ball residue in Step 910 includes improving the release of the deposited solder paste in response to the lower range aspect ratio mask openings.

In some aspects, forming an opening having an aspect ratio in Step 908 includes forming a higher range aspect ratio. Depositing solder paste to overlie the ball residue in Step 910 includes increasing the volume of the deposited solder paste in response to the higher range aspect ratio mask openings.

In some aspects, forming a thick film mask in Step 908 includes forming an opening having a diameter an aspect ratio to form an aperture volume that is in the range of 15 to 30 percent of the volume of the solder ball that was removed (or to be reattached). Depositing solder paste to overlie the ball residue in Step 910 includes increasing the volume of the deposited solder paste in response to larger diameter mask openings.

In some aspects of the invention, depositing solder paste in Step 910 includes depositing solder paste having a melting temperature in the range from 183 to 225 degrees C. Attaching solder balls to the solder paste in Step 912 includes heating the circuit package to melt the solder paste.

In some aspects of the invention, removing the exposed solder balls in Step 904 includes removing the solder balls with a process selected from the group including shearing, grinding, and chemical-mechanical polishing (CMP). Removing the exposed solder balls in Step 904 typically includes removing the exposed solder balls at room temperature.

In some aspects, forming a thin film mask overlying a first surface of a ball grid array circuit package in Step 902 includes forming a mask having a substantially planar surface with openings to expose the solder balls attached to the underlying circuit package surface.

In some aspects, forming a thin film mask overlying a first surface of a ball grid array circuit package in Step 902 includes forming a mask having a thickness in the range from 2 to 5 mils.

In some aspects, forming a thin film mask overlying a first surface of a ball grid array circuit package in Step 902 includes forming a thin film mask from a stainless steel material. Alternate material include metals such as molybdenum and hard plastics.

In some aspects, forming a thin film mask overlying a first surface of a ball grid array circuit package in Step 902 includes sub-steps. Step 902a forms a mask having a substantially planar surface with openings. Step 902b aligns the mask openings with the solder balls attached to the circuit package surface. Step 902c deposits the mask on the circuit package surface. In other aspects of the invention, the balls attached to the circuit package are selected from the group including ball grid array (BGA) balls, C4 balls, chip scale package (CSP) balls, flip chip bumps, and solder columns. In some aspects, the balls are selected from the group including eutectic solder, eutectic/high lead solder, and high lead balls. Typically, the solder balls have a melting temperature of 183 degrees C., or higher. In some aspects, the ball grid array circuit package is selected from the group including flip chip, chip scale, ball grid array, ceramic, and semiconductor packages.

A system and method have been provided for removing and reworking solder balls. Although the invention have largely been demonstrated in the context of BGA solder balls and BGA style packages, the thin-film mask and related procedures can be scaled for other geometries. Other variations and embodiments will occur to those skilled in the art.

We claim:

1. A method for removing solder balls attached to a ball grid array circuit package, the method comprising:

forming a thin film mask overlying a first surface of a ball grid array circuit package, exposing solder balls attached to pad areas of the surface;

removing the exposed solder balls; and removing the thin film mask.

2. The method of claim 1 wherein removing the exposed solder balls includes removing the solder balls with a process selected from the group including shearing, grinding, and chemical-mechanical polishing (CMP).

3. The method of claim 2 wherein forming a thin film mask overlying a first surface of a ball grid array circuit package includes forming a mask having a substantially planar surface with openings to expose the solder balls attached to the underlying circuit package surface.

4. The method of claim 3 wherein forming a thin film mask overlying a first surface of a ball grid array circuit package includes forming a mask having a thickness in the range from 2 to 5 mils.

5. The method of claim 3 wherein forming a thin film mask overlying a first surface of a ball grid array circuit package includes forming a mask having a maximum thickness approximately equal to one-third the solder ball diameter.

6. The method of claim 3 wherein forming a thin film mask overlying a first surface of a ball grid array circuit package includes forming a thin film mask from a material selected from the group including stainless steel, molybdenum, and hard plastics.

7. The method of claim 1 wherein forming a thin film mask overlying a first surface of a ball grid array circuit package includes:

forming a mask having a substantially planar surface with openings;

aligning the mask openings with the solder balls attached to the circuit package surface; and depositing the mask on the circuit package surface.

8. The method of claim 7 in which the balls attached to the circuit package are selected from the group including ball grid array (BGA) balls, C4 balls, chip scale package (CSP) balls, flip chip bumps, and solder columns.

9. The method of claim 8 in which the balls are selected from the group including eutectic solder, eutectic/high lead solder, and high lead balls.

10. The method of claim 8 wherein the solder balls have a melting temperature of 183 degrees C., or higher.

11. The method of claim 1 in which the ball grid array circuit package is selected from the group including flip chip, chip scale, ball grid array, ceramic, and semiconductor packages.

12. The method of claim 1 wherein removing the exposed solder balls includes removing the exposed solder balls at room temperature.

13. A method for reworking solder balls attached to a ball grid array circuit package, the method comprising:

forming a thin film mask overlying a first surface of a ball grid array circuit package, exposing solder balls attached to pad areas of the surface;

removing the exposed solder balls to leave a ball residue attached to the surface pads;

removing the thin film mask;

forming a thick film mask overlying the first surface, exposing the ball residue attached to the surface pads;

depositing a eutectic solder paste over the ball residue; and attaching solder balls to the solder paste.

14. The method of claim 13 wherein forming a thick film mask includes forming a substantially planar surface with openings to expose the ball residue.

15. The method of claim 14 wherein forming a thick film mask includes forming a mask having a thickness in the range from 5 to 10 mils.

16. The method of claim 15 wherein forming a thick film mask includes forming an opening having a diameter and an aspect ratio to form an aperture volume that is in the range of 15 to 30% of the solder ball volume.

17. The method of claim 16 wherein forming an opening having an aspect ratio includes forming a higher range aspect ratio; and wherein depositing solder paste to overlie the ball residue includes increasing the volume of the deposited solder paste in response to the higher range aspect ratio mask openings.

18. The method of claim 13 wherein depositing solder paste includes depositing eutectic solder paste having a melting temperature in the range from 183 to 225 degrees C.; and wherein attaching solder balls to the solder paste includes heating the circuit package to melt the solder paste.

19. The method of claim 18 wherein removing the exposed solder balls includes removing the solder balls with a process selected from the group including shearing, grinding, and chemical-mechanical polishing (CMP).

20. The method of claim 13 wherein forming a thin film mask overlying a first surface of a ball grid array circuit package includes forming a mask having a substantially planar surface with openings to expose the solder balls attached to the underlying circuit package surface.

21. The method of claim 20 wherein forming a thin film mask overlying a first surface of a ball grid array circuit package includes forming a mask having a thickness in the range from 2 to 5 mils.

22. The method of claim 20 wherein forming a thin film mask overlying a first surface of a ball grid array circuit package includes forming a mask having a thickness that is approximately one-third the solder ball diameter.

23. The method of claim 20 wherein forming a thin film mask overlying a first surface of a ball grid array circuit package includes forming a thin film mask from a material selected from the group of materials including stainless steel, molybdenum, and hard plastic.

24. The method of claim 13 wherein forming a thin film mask overlying a first surface of a ball grid array circuit package includes:

forming a mask having a substantially planar surface with openings;

aligning the mask openings with the solder balls attached to the circuit package surface; and depositing the mask on the circuit package surface.

25. The method of claim 24 in which the solder balls attached to the circuit package are selected from the group including ball grid array (BGA) balls, C4 balls, chip scale package (CSP) balls, and flip chip bumps.

26. The method of claim 25 in which the solder balls are selected from the group including eutectic solder, eutectic/high lead solder, and high lead balls.

27. The method of claim 26 wherein the solder balls have a melting temperature of 183 degrees C., or higher.

28. The method of claim 13 in which the ball grid array circuit package is selected from the group including flip chip, chip scale, ball grid array, ceramic, and semiconductor packages.

29. The method of claim 13 wherein removing the exposed solder balls includes removing the exposed solder balls at room temperature.

30. A solder ball removal device, for use in demounting solder balls soldered to a circuit package surface, the device comprising:

a thin planar sheet of film, formed to overlie a circuit package surface to receive a removal element; and openings in the film to expose solder balls attached to the circuit package surface.

31. The device of claim 30 wherein the film has a thickness in the range from 2 to 5 mils.

32. The device of claim 30 wherein the removal element is selected from group including a shear, a grinder, and a chemical-mechanical polisher (CMP).

33. The device of claim 30 wherein the film is a material selected from the group including stainless steel, molybdenum, and hard plastic.

34. The device of claim 30 wherein the film has a thickness that is approximately two-ninths (2/9) the height of the solder ball to be removed.

* * * * *